US012334415B2

(12) United States Patent
Lee et al.

(10) Patent No.: US 12,334,415 B2
(45) Date of Patent: Jun. 17, 2025

(54) THROUGH VIAS WITH TEST STRUCTURE

(71) Applicant: CHANGXIN MEMORY TECHNOLOGIES, INC., Hefei (CN)

(72) Inventors: Tzung-Han Lee, Hefei (CN); Chih-Cheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 577 days.

(21) Appl. No.: 17/672,757

(22) Filed: Feb. 16, 2022

(65) Prior Publication Data

US 2023/0046800 A1 Feb. 16, 2023

Related U.S. Application Data

(63) Continuation of application No. PCT/CN2021/116890, filed on Sep. 7, 2021.

(30) Foreign Application Priority Data

Aug. 16, 2021 (CN) .......................... 202110935666.6

(51) Int. Cl.
*H01L 21/768* (2006.01)
*H01L 21/66* (2006.01)
*H01L 23/48* (2006.01)
*H01L 23/522* (2006.01)
*H01L 23/528* (2006.01)

(52) U.S. Cl.
CPC ...... *H01L 23/481* (2013.01); *H01L 21/76877* (2013.01); *H01L 21/76898* (2013.01); *H01L 22/14* (2013.01)

(58) Field of Classification Search
CPC ............. H01L 23/481; H01L 21/76877; H01L 21/76898; H01L 22/14; H01L 23/528; H01L 22/34; H01L 22/32; H01L 23/522
See application file for complete search history.

(56) References Cited

U.S. PATENT DOCUMENTS

| | | | |
|---|---|---|---|
| 6,787,802 | B2 | 9/2004 | Yokogawa |
| 8,748,305 | B2 | 6/2014 | Chen |
| 2003/0230810 | A1 | 12/2003 | Yokogawa |
| 2005/0032253 | A1 | 2/2005 | Hsu |
| 2005/0266677 | A1 | 12/2005 | Hayashi |
| 2008/0305628 | A1 | 12/2008 | Hayashi |
| 2011/0115073 | A1 | 5/2011 | Chen |

(Continued)

FOREIGN PATENT DOCUMENTS

| | | |
|---|---|---|
| CN | 102064155 A | 5/2011 |
| CN | 102194795 A | 9/2011 |

(Continued)

*Primary Examiner* — Herve-Louis Y Assouman
(74) *Attorney, Agent, or Firm* — Kilpatrick Townsend & Stockton LLP

(57) ABSTRACT

A semiconductor structure includes: a semiconductor substrate; a first metal layer located on a surface of the semiconductor substrate; a second metal layer located above a surface of the first metal layer; an insulating layer located between the first metal layer and the second metal layer and configured to isolate the first metal layer from the second metal layer; and at least four vias located in the insulating layer and a conductive material for connecting the first metal layer and the second metal layer is filled in the at least four vias.

15 Claims, 13 Drawing Sheets

(56) References Cited

U.S. PATENT DOCUMENTS

2018/0182677 A1    6/2018  Csaszar
2020/0303268 A1*  9/2020  Kim ........................ H01L 24/05

FOREIGN PATENT DOCUMENTS

| CN | 105097778 A | 11/2015 |
|----|-------------|---------|
| CN | 206148425 U | 5/2017 |
| CN | 106409815 B | 3/2019 |
| CN | 109786359 A | 5/2019 |
| CN | 110335861 A | 10/2019 |
| CN | 111128997 A | 5/2020 |

* cited by examiner

THROUGH VIAS WITH TEST STRUCTURE

CROSS-REFERENCE TO RELATED APPLICATIONS

This application is a continuation of International Application No. PCT/CN2021/116890, filed on Sep. 7, 2021, which is based upon and claims priority to Chinese Patent Application No. 202110935666.6, filed on Aug. 16, 2021. The disclosures of International Application No. PCT/CN2021/116890 and Chinese Patent Application No. 202110935666.6 are hereby incorporated by reference in their entireties.

TECHNICAL FIELD

The embodiments of the present disclosure relate, but are not limited, to a semiconductor structure and a method for manufacturing a semiconductor structure.

BACKGROUND

Semiconductor devices, such as a memory and a chip, are usually realized by adopting a multi-layer structure on a semiconductor substrate. The electrical connection of each layer on a surface of the semiconductor substrate is realized by metal wires, and the metal wires of different layers are connected through a via. A resistance value of the via is an important parameter affecting the connection performance. Therefore, a test key is usually formed in the manufacturing process for resistance testing of the via.

However, the test key is located at the periphery of a device and there are no other patterns around it, which is easy to cause deformation of the via, so that a test result is difficult to reflect the actual resistance value of the via inside the device.

SUMMARY

Embodiments of the disclosure provide a semiconductor structure and a method for manufacturing a semiconductor structure.

In a first aspect, the semiconductor structure provided in an embodiment of the disclosure may include a semiconductor substrate, a first metal layer, a second metal layer, an insulating layer and at least four vias. The first metal layer is located on a surface of the semiconductor substrate. The second metal layer is located above a surface of the first metal layer. The insulating layer is located between the first metal layer and the second metal layer, and configured to isolate the first metal layer from the second metal layer. The at least four vias are located in the insulating layer, and a conductive material for connecting the first metal layer and the second metal layer is filled in the at least four vias.

In a second aspect, an embodiment of the disclosure provides a method for manufacturing a semiconductor structure, which may include the following operations. A first metal layer is formed on a surface of a semiconductor substrate. An insulating layer is covered on the first metal layer. At least four vias penetrating through the insulating layer and connected to the first metal layer are formed. The at least four vias are filled with a conductive material. A second metal layer is formed on the insulating layer and the at least four vias. The conductive material in the at least four vias is used for connecting the first metal layer and the second metal layer.

BRIEF DESCRIPTION OF THE DRAWINGS

One or more embodiments are illustrated exemplarily by corresponding accompanying drawings. Unless otherwise stated, the accompanying drawings do not constitute a proportional limitation.

DETAILED DESCRIPTION

In order to facilitate the understanding of the disclosure, the disclosure will be described in more detail below with reference to related accompanying drawings. Preferred embodiments of the disclosure are shown in the accompanying drawings. However, the disclosure may be implemented in many different forms and are not limited to the embodiments described herein. On the contrary, an objective of providing these embodiments is to make the disclosed content of the disclosure more thorough and comprehensive.

Unless otherwise defined, all technical and scientific terms used herein shall have the same meanings as commonly understood by those skilled in the art to which the disclosure belongs. The terms used herein in the specification of the disclosure are only used to describe specific embodiments, but are not intended to limit the disclosure. The term "and/or" used herein includes any and all combinations of one or more of the associated listed items.

Figure 1:
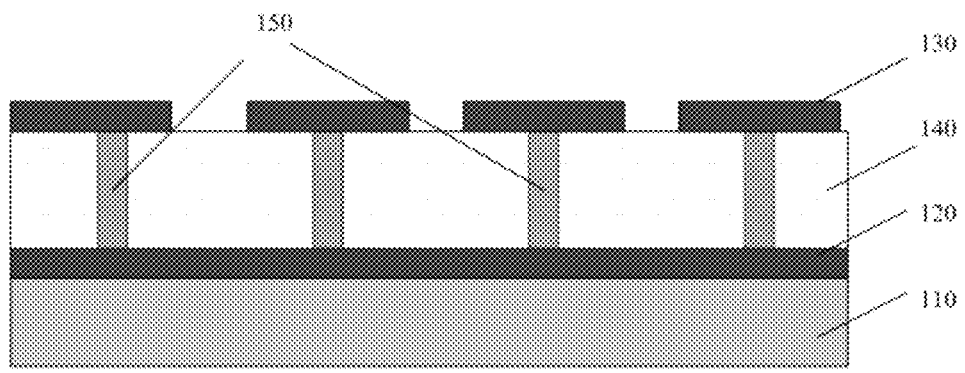
FIG. 1 is a first schematic diagram of a semiconductor structure provided in an embodiment of the disclosure.

The embodiment of the disclosure provides a semiconductor structure. As illustrated in FIG. 1, the semiconductor structure 100 includes a semiconductor substrate 110, a first metal layer 120, a second metal layer 130, an insulating layer 140 and at least four vias 150.

The first metal layer 120 is located on a surface of the semiconductor substrate 110.

The second metal layer 130 is located above a surface of the first metal layer 120.

The insulating layer 140 is located between the first metal layer 120 and the second metal layer 130, and is configured to isolate the first metal layer 120 from the second metal layer 130.

The at least four vias 150 are located in the insulating layer 140, and a conductive material for connecting the first metal layer 120 and the second metal layer 130 is filled in the at least four vias.

In the embodiment of the disclosure, the semiconductor structure may be a test structure, or called a test key, located around a semiconductor device and configured to perform testing. The semiconductor structure may be formed synchronously with the semiconductor device in the process of manufacturing various semiconductor devices (such as a memory and a chip) by using a wafer. Since the semiconductor structure is separated from the semiconductor device, the performance of the semiconductor device is not affected.

The semiconductor structure may be configured to perform testing in the manufacturing process of the semiconductor devices, so as to realize the process monitoring of the semiconductor devices. When manufacturing of the semiconductor devices is completed, an area where the semiconductor structure is located may be cut off, only the semiconductor devices may be retained, and the semiconductor devices may be packaged respectively. Alternatively, the above semiconductor structure may also be retained and packaged with the semiconductor device together, so as to facilitate the test of a product.

The first metal layer and the second metal layer are metal layers formed synchronously with different metal layers in the semiconductor device. Both the first metal layer and the second metal layer may have patterns formed by etching, such as linear or reticulated patterns. The first metal layer and the second metal layer are isolated from each other through the insulating layer. The insulating layer may be made of insulating materials such as silicon oxide or silicon nitride.

The first metal layer and the second metal layer may be connected with each other through the vias, which penetrate through the insulating layer and are connected to the first metal layer and the second metal layer. In the vias, it may be filled with conductive material, such as metal, and the electrical connection between the first metal layer and the second metal layer is realized through the conductive materials.

In the embodiment of the disclosure, the number of the vias is at least four. These vias may be spaced apart from each other at different positions and connected to the first metal layer and the second metal layer respectively.

Figure 2:
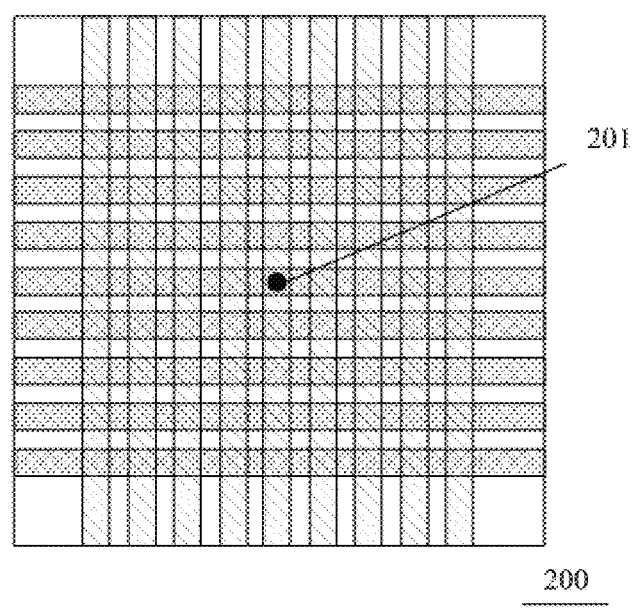
FIG. 2 is a second schematic diagram of a semiconductor structure provided in an embodiment of the disclosure.

Since there are a plurality of vias in the whole semiconductor structure, compared with the test structure only with one via 201 in the semiconductor structure 200 illustrated in FIG. 2, each via in the embodiment of the disclosure is supported by other vias and other structures in the vicinity. In this way, on the one hand, it may reduce the inaccurate test caused by deformation of the vias; on the other hand, the plurality of vias facilitate flexible testing, making the test results closer to the actual resistance value of the via in the device.

In some embodiments, the first metal layer includes a plurality of bottom metal wires distributed in parallel along a first direction.

The second metal layer includes a plurality of top metal wires distributed in parallel along a second direction, and the second direction is perpendicular to the first direction.

In the embodiment of the disclosure, the first metal layer may be a linear metal wire and may include a plurality of metal wires distributed side by side. Since the first metal layer is a metal layer close to a surface of the substrate, these metal wires may be called bottom metal wires. Here, a plurality of bottom metal wires may be distributed in parallel along the first direction, and the first direction may be any direction parallel to the surface of the substrate, whichever is convenient to realize during the actual manufacturing process.

In the embodiment of the disclosure, similar to the structure of the first metal layer, the second metal layer may be a plurality of metal wires distributed in parallel. Relative to the first metal layer, the second metal layer is located away from the surface of the substrate, so that it may be called the top metal wires. A plurality of top metal wires are distributed in parallel along the second direction. The second direction may be perpendicular to the first direction, which may make the structure more stable.

Figure 3:
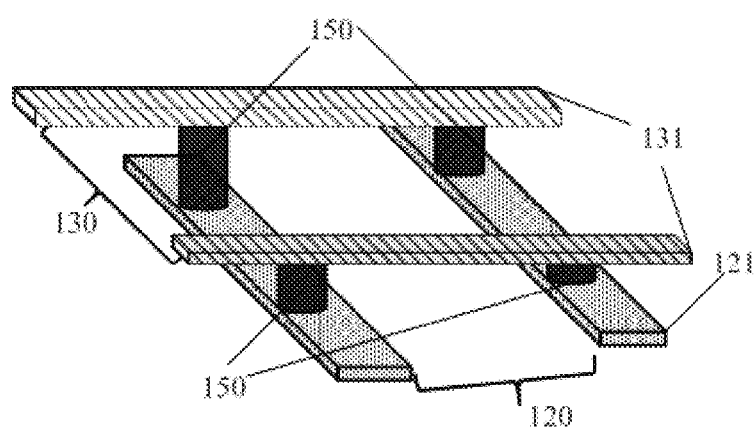
FIG. 3 is a third schematic diagram of a semiconductor structure provided in an embodiment of the disclosure.

In some embodiments, as illustrated in FIG. 3, the at least four vias 150 are respectively located at overlapping positions of at least two of the bottom metal wires 121 in the first metal layer 120 and at least two of the top metal wires 131 in the second metal layer 130.

The metal wires of the first metal layer and the metal wires of the second metal layer are perpendicular to each other. Therefore, each bottom metal wire of the first metal layer and each top metal wire of the second metal layer has an overlapping position. These overlapping positions are located in the same straight line in the direction perpendicular to the surface of the substrate. Therefore, the at least four vias as mentioned above may be formed at these overlapping positions, so as to realize the connection between the first metal layer and the second metal layer.

Since the first metal layer and the second metal layer have a plurality of metal wires, they may have a plurality of overlapping positions, each overlapping position may form one via, and the plurality of vias may be located at different overlapping positions respectively.

In some embodiments, the at least four vias include four test vias. The four test vias are respectively located at four overlapping positions of two of the top metal wires and two of the bottom metal wires.

In the embodiment of the disclosure, the above-mentioned semiconductor structure may include four test vias which are used for testing the resistance value. Therefore, the metal wires where these test vias are located may be connected with an external test circuit. Of course, during the testing, a test may also be carried out by the way that a probe makes direct contact with the positions of the vias or metal wires.

The four test vias may be located at the four overlapping positions of two of the top metal wires and two of the bottom metal wires. Since each metal wire is connected with two vias and the two vias are connected to different metal wires of another layer, the four test vias may be connected to different combinations of these four metal wires, thus, during the testing, four groups of test data are obtained which facilitates adequate data processing and improves the reliability of the test.

In some embodiments, there is a top metal wire located between and configured to space apart the two top metal wires connected with the test vias. There is a bottom metal wire located between and configured to space apart the two bottom metal wires connected with the test vias.

The above-mentioned two top metal wires connected with the test vias and the two bottom metal wires connected with the test vias may be two parallel top metal wires not adjacent to one another, that is, there may be one or more top metal wires located between the two top metal wires connected with the test vias. Here, there is one metal wire located between and configured to space apart the two top metal wires connected with the test vias, and there is one metal wire located between and configured to space apart the two bottom metal wires connected with the test vias.

In this way, on the one hand, there may be certain spacing between the various test vias, which may improve the stability of the overall structure; on the other hand, the interference between the vias during the testing may be reduced.

Figure 4:
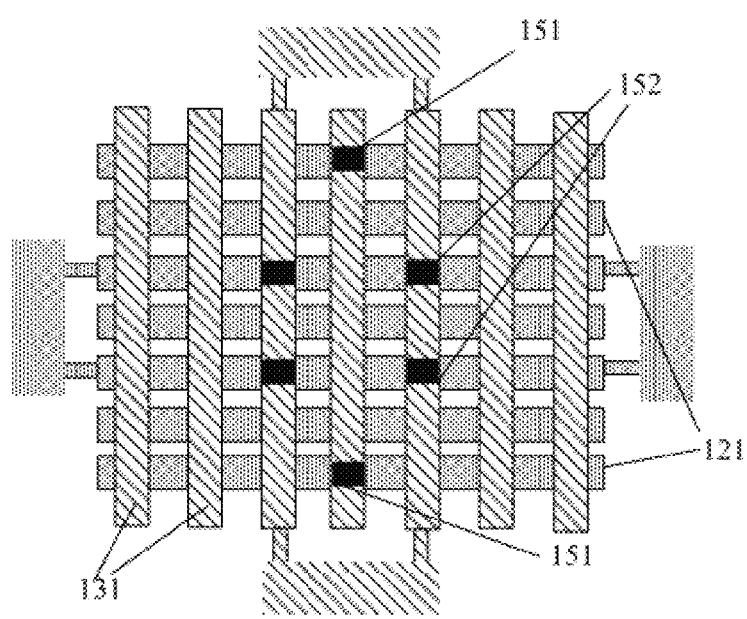
FIG. 4 is a fourth schematic diagram of a semiconductor structure provided in an embodiment of the disclosure.

In some embodiments, as illustrated in FIG. 4, the at least four vias 150 further include at least one pair of auxiliary vias 151 and at least four test vias 152. The at least one pair of auxiliary vias 151 is connected to the top metal wires 131 configured to space apart the two top metal wires connected with the test vias or the bottom metal wires 121 configured to space apart the two bottom metal wires connected with the test vias, and a spacing between the pair of auxiliary vias 151 is greater than a spacing between any two of the test vias 152.

In some embodiments, the center of the semiconductor structure may be provided with auxiliary vias.

The spacing between every two vias of the above-mentioned four vias may be equal, so that it has a stable structure and facilitates the testing. Moreover, there are also metal wires between and configured to space apart the metal wires where the vias are located, therefore, auxiliary vias may be formed on the metal wires between and configured to space apart the metal wires where the vias are located, to facilitate the auxiliary testing. The auxiliary vias appear in pairs and are connected with the same top metal wire or the same bottom metal wire. A spacing between the auxiliary vias may be greater than a spacing between the test vias, so as not to interfere with the test vias.

In some embodiments, the two top metal wires connected to the test vias are connected through test pads. The two bottom metal wires connected to the test vias are connected through test pads.

Figure 5A:
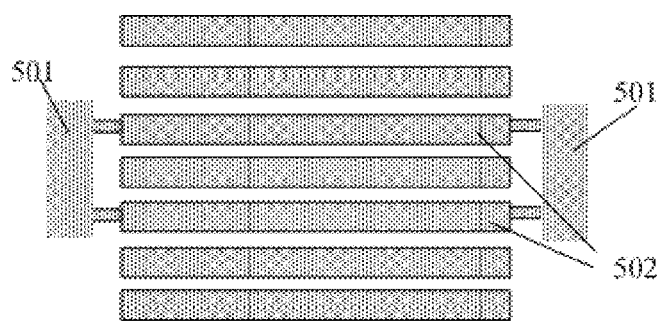
FIG. 5A and FIG. 5B are schematic diagrams of a first metal layer in a semiconductor structure provided in an embodiment of the disclosure.
Figure 5B:
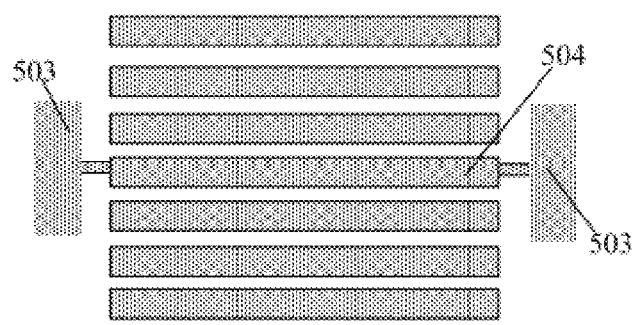

That is, the top metal wires connected to the test vias are connected with each other through the test pads, and the bottom metal wires are also connected through the other test pads (as illustrated in FIG. 5A, the test pads 501 are connected to two bottom metal wires 502), so that the test vias are connected with each other through the various metal wires. Therefore, the test of resistance may be realized through a set of external test paths. The various test vias are connected with each other, so that the calculation can be performed based on data obtained from the test to obtain average resistance value of each via. Compared with the case where the test pads 503 are only connected to a bottom metal wire 504 as illustrated in FIG. 5B, it is possible to estimate the resistance value of each via in the semiconductor device more accurately, and thus judge whether there is a possibility of failure of the device.

It is to be noted that the metal wires connected to the auxiliary vias are not connected with the metal wires connected to the test vias, so that an individual test may be performed. Therefore, auxiliary test data may be provided during the test process to facilitate the verification of the reliability of the test.

Figure 6:
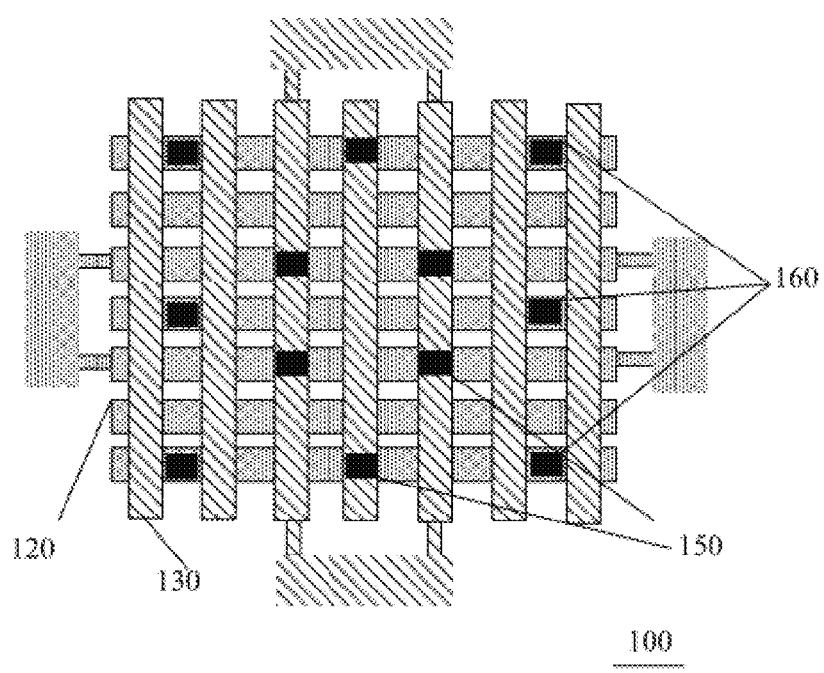
FIG. 6 is a fifth schematic diagram of a semiconductor structure provided in an embodiment of the disclosure.

In some embodiments, as illustrated in FIG. 6, the semiconductor structure 100 may also include at least two dummy vias 160.

The at least two dummy vias 160 penetrate through the insulating layer and are connected to any one of the first metal layer 120 or the second metal layer 130. A pattern formed by the distribution positions of the at least two dummy vias 160 and the distribution positions of the at least four vias 150 is centrosymmetric or axisymmetric.

In the embodiment of the disclosure, each dummy via has a structure similar to that of the test via or auxiliary via and penetrates through the insulating layer. The conductive material, such as metal, may also contained in the dummy via, but it does not have the function of communicating the first metal layer and the second metal layer. That is, the dummy via may be only connected to the first metal layer or only connected to the second metal layer.

The dummy vias may be configured to support the whole semiconductor structure. For example, the position distribution of the dummy vias and other vias may be centrosymmetric or axisymmetric, so as to make the semiconductor structure more stable. In addition, the dummy vias may also form a structure of simulating actual vias in the semiconductor device together with the test vias, the auxiliary vias and the like, so that the test data of the test vias is closer to the actual data of the vias in the semiconductor device.

In some embodiments, the test vias form a first axisymmetric distribution with the center line of the semiconductor structure as the axis, and the distance from the test vias in the first axisymmetric distribution to the center of the semiconductor structure may be different. The auxiliary vias and the dummy vias together form a second axisymmetric distribution with the center line of the semiconductor structure as the axis, and the distance from the vias in the second axisymmetric distribution to the center of the semiconductor structure may be different. The ratio of the distance between any two of the test vias in the first axisymmetric distribution to the distance from any one test via to the center of the semiconductor structure is in a range of 1.5 to 3. The ratio of the distance from a via in the second axisymmetric distribution to the center of the semiconductor structure to the distance from a via in the first axisymmetric distribution to the center of the semiconductor structure is greater than 3.

In some embodiments, the test vias form a first centrosymmetric distribution centered on the center of the semiconductor structure, and the distance from each test via in the first centrosymmetric distribution to the center of the semiconductor structure is the same. The auxiliary vias and the dummy vias together form a second centrosymmetric distribution centered on the center of the semiconductor structure, and the distance from each vias in the second centrosymmetric distribution to the center of the semiconductor structure is the same.

In some embodiments, each dummy via is filled with an insulating material.

Therefore, the dummy vias may play a supporting role, prevent the other vias from being deformed, and prevent the dummy via from electrically interfering with the first metal layer, the second metal layer or other vias.

In some embodiments, the at least four vias are configured for resistance testing by Kelvin Four-terminal sensing.

The Kelvin Four-terminal sensing is also called Four-wire sensing, or Four-point probe method. By separating electrodes of current and voltage, the method may eliminate the impedance of wiring and contact resistance, so as to realize accurate resistance test. In the embodiment of the disclosure, the metal wires connected to at least four vias as described above may be connected to different testing terminals respectively, so as to realize four-terminal sensing, which improves the accuracy of the testing, compared with a single point test method.

Figure 7:
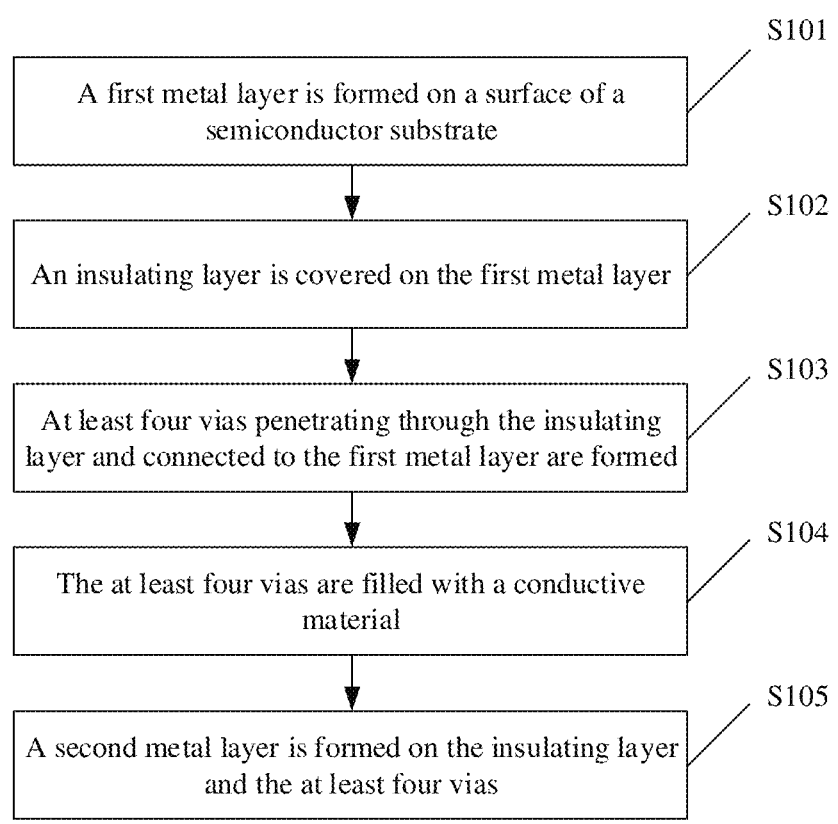
FIG. 7 is a flowchart of a method for manufacturing a semiconductor structure provided in an embodiment of the disclosure.

As illustrated in FIG. 7, an embodiment of the disclosure provides a method for manufacturing a semiconductor structure, which may include the following steps.

At S101, a first metal layer is formed on a surface of a semiconductor substrate.

At S102, an insulating layer is covered on the first metal layer.

At S103, at least four vias penetrating through the insulating layer and connected to the first metal layer are formed.

At S104, the at least four vias are filled with a conductive material.

At S105, a second metal layer is formed on the insulating layer and the at least four vias, and the conductive material in the at least four vias is used for connecting the first metal layer and the second metal layer.

Since the semiconductor structure may be a test structure located around the semiconductor device and configured to perform the testing, the manufacturing process of the semiconductor structure is carried out synchronously in the process of manufacturing a semiconductor device product. The first metal layer, the second metal layer and the insulating layer are all formed in correspondence and synchronously with each layer in the semiconductor device.

Figure 8A:
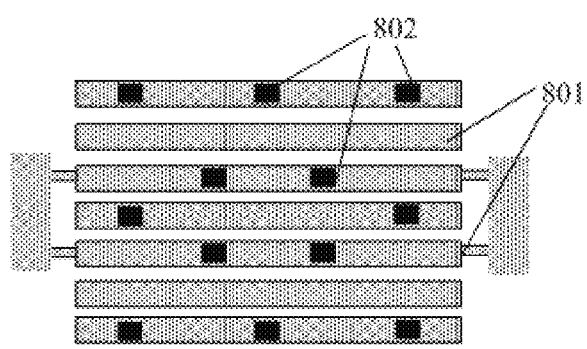
FIG. 8A is a schematic diagram that a plurality of vias are synchronously formed in a method for manufacturing a semiconductor structure provided in an embodiment of the disclosure.
Figure 8B:
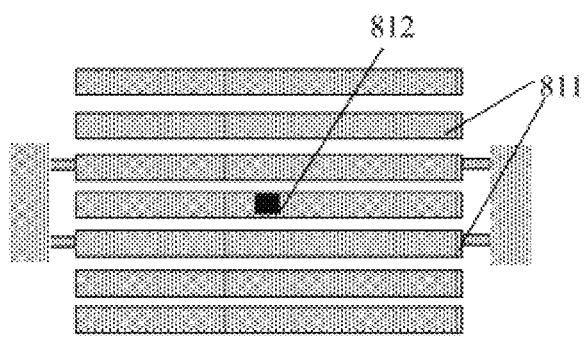
FIG. 8B is a schematic diagram of one via formed in an embodiment.

The above-mentioned at least four vias are also synchronized with the process of forming the vias in the semiconductor device. As illustrated in FIG. 8A, after the first metal layer 801 is formed and covered with the insulating layer (not illustrated in the figure), a plurality of vias 802 are formed synchronously at a plurality of target positions, and then the subsequent manufacturing process related to the second metal layer and the like are carried out. Compared with the way in which only one via 812 is formed in the first metal layer 811 as illustrated in FIG. 8B, it allows the whole structure to be more stable and closer to the actual structure of the semiconductor device, so that these vias can be configured to reflect the quality of the whole manufacturing process.

In some embodiments, forming the first metal layer on the surface of the semiconductor substrate includes the following operations.

A plurality of bottom metal wires distributed in parallel along a first direction are formed on the surface of the semiconductor substrate.

Forming the second metal layer on the insulating layer and the at least four vias includes the following operations.

A plurality of top metal wires distributed in parallel along a second direction are formed on the insulating layer and the at least four vias, and the second direction is perpendicular to the first direction.

Here, a metal layer may be formed on the surface of the semiconductor substrate, and then a plurality of metal wires may be formed by means of graphical etching. A first metal layer with a plurality of bottom metal wires can also be formed by forming a patterned mask layer on the semiconductor substrate, and then, depositing metal and forming a plurality of metal wires in an area not masked by the mask layer, and then removing the mask layer.

After the first metal layer is formed, an insulating material may be deposited on the first metal layer to form an isolation layer.

In some embodiments, forming the at least four vias penetrating through the insulating layer and connected to the first metal layer includes the following operations.

Four test vias penetrating through the insulating layer and connected to the bottom metal wire are formed at four target positions of the two bottom metal wires. Each bottom metal wire includes two target positions distributed along a second direction, and two adjacent target positions located on the two bottom metal wires are distributed along a first direction.

Forming a plurality of top metal wires distributed in parallel along a second direction on the insulating layer and the at least four vias includes the following operations.

A top metal wire is formed above two target positions distributed along the first direction, and the target positions are the positions where two top metal wires and two bottom metal wires overlap.

After the insulating layer is formed, the insulating layer may be perforated at the target positions by etching and other methods to form the above-mentioned four test vias. The depth of each vias is the thickness of the insulating layer. With the vias penetrating through the insulating layer, the surface of the insulating layer may be communicated with the bottom metal wires. Then, conductive material, such as tungsten, copper or other compound conductive material, may be filled in the vias or covered on inner walls of the vias. The conductive material is connected with the bottom metal wires through vias and communicated to the top of the insulating layer.

The top metal wires may continue to be formed on the top of the insulating layer, and the top metal wires and the bottom metal wires are distributed perpendicular to each other, so that there is an overlapping position between each metal wire of a top layer and each metal wire of a bottom layer. The test vias may penetrate through the insulating layer at the overlapping positions, so that the top metal layer and the bottom metal layer may be connected.

In some embodiments, forming at least four vias penetrating through the insulating layer and connected to the first metal layer further includes the following operations.

At least one pair of auxiliary vias penetrating through the insulating layer and connected to different bottom metal wires respectively are formed in a top metal wire located between the two top metal wires, and a spacing between the pair of auxiliary vias is greater than a spacing between any two of the test vias.

In the embodiment of the disclosure, before the top metal wires are formed, auxiliary vias may also be formed at the corresponding positions of a top metal wire located between the corresponding positions of the top metal wires (not formed at this time) where the above-mentioned test vias are located, and the auxiliary vias may be connected with the bottom metal wire. The bottom metal wire connected with the auxiliary vias is also located between the two bottom metal wires connected with the above-mentioned test vias, and the bottom metal wire connected with the auxiliary vias is not connected with other bottom metal wires. Therefore, the auxiliary vias may be used for individual testing to provide data to assist in judging the resistance values of the vias.

After the test vias and the auxiliary vias are formed, the top metal wires may be formed on the insulating layer, and the top metal wires may be connected with the test vias and the auxiliary vias respectively.

In some embodiments, the method further includes the following operations.

At least two dummy vias are formed, the dummy vias penetrate through the insulating layer and are connected to any one of the first metal layer or the second metal layer, and a pattern formed by the distribution positions of the at least two dummy vias and the distribution positions of the at least four vias is centrosymmetric or axisymmetric.

In the embodiment of the disclosure, after the insulating layer is formed and before the top metal wires are formed, dummy vias penetrating through the insulating layer may also be formed. The position of each dummy via is not the overlapping position of a bottom metal line and a top metal line. That is, one end of the dummy via may be connected with the bottom metal wire, but the other end will not be connected with the top metal wire, or one end of the dummy via may be connected with the top metal wire, but the other end will not be connected with the bottom metal wire. Therefore, the top metal wire and the bottom metal wire will not be connected.

In some embodiments, the method further includes the following operations.

The at least two dummy vias are filled with an insulating material.

The dummy vias may be configured to provide support, which allows the whole semiconductor structure to simulate an internal structure of a semiconductor device, which reduces the probability of deformation of the test vias, and thus improves the test performance of the test vias. Since the dummy vias do not need to be electrical connected, the interior of the dummy vias may be filled with the insulating material, which may be of a type such as silicon oxide, silicon nitride or other organic material.

In some embodiments, the dummy vias are connected to the first metal layer. The method also includes the following operations.

A covering layer is formed, and the covering layer is filled between the top metal wires and covers the dummy vias.

One end of a dummy via may be connected with the first metal layer, that is, may be connected with at least one bottom metal wire and penetrates through the insulating layer. The other end of the dummy via is exposed at the top of the insulating layer and is located between the top metal wires.

In the embodiment of the disclosure, it is possible to continue to form a cover layer after the second metal layer is formed, to cover the dummy vias exposed at the top of the insulating layer, and to fill between the top metal wires of the second metal layer, so that the various top metal wires are isolated from each other through the covering layer.

The material of the covering layer is an insulating material, which may be silicon oxide, silicon nitride or other organic material.

The embodiment of the disclosure also provides the following examples.

For the Back End of Line (BEOL) process of Metal-Oxide-Semiconductor (MOS) Field-Effect Transistor devices and the like, each layer of metal is connected through the vias. The traditional Isolation Test-key (ISO Test-key) generally tests the resistance value of a single via.

Figure 9:
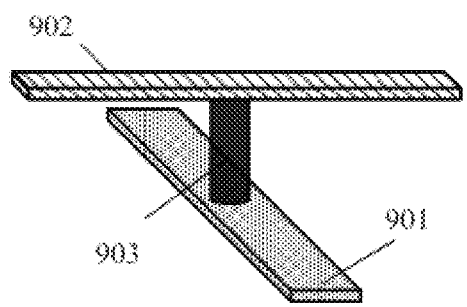
FIG. 9 is a schematic diagram of a semiconductor structure in an embodiment.

As illustrated in FIG. 9, the test structure including a single via includes a bottom metal wire 901, a top metal wire 902 and a test via 903 located at the overlapping position of the bottom metal wire and the top metal wire and connected with the bottom metal wire and the top metal wire. The via of this structure is susceptible to the influence of the surrounding isolation layer, resulting in an unstable photoetching process, and there are no other pattern structures around a single test via, which can easily cause the deformation of the test via during the subsequent processes of flattening the metal layer and the like, making them untestable. Moreover, there is a high probability of error in the resistance value of the single test via, which may not accurately reflect the actual resistance value of the via in the device.

Figure 10:
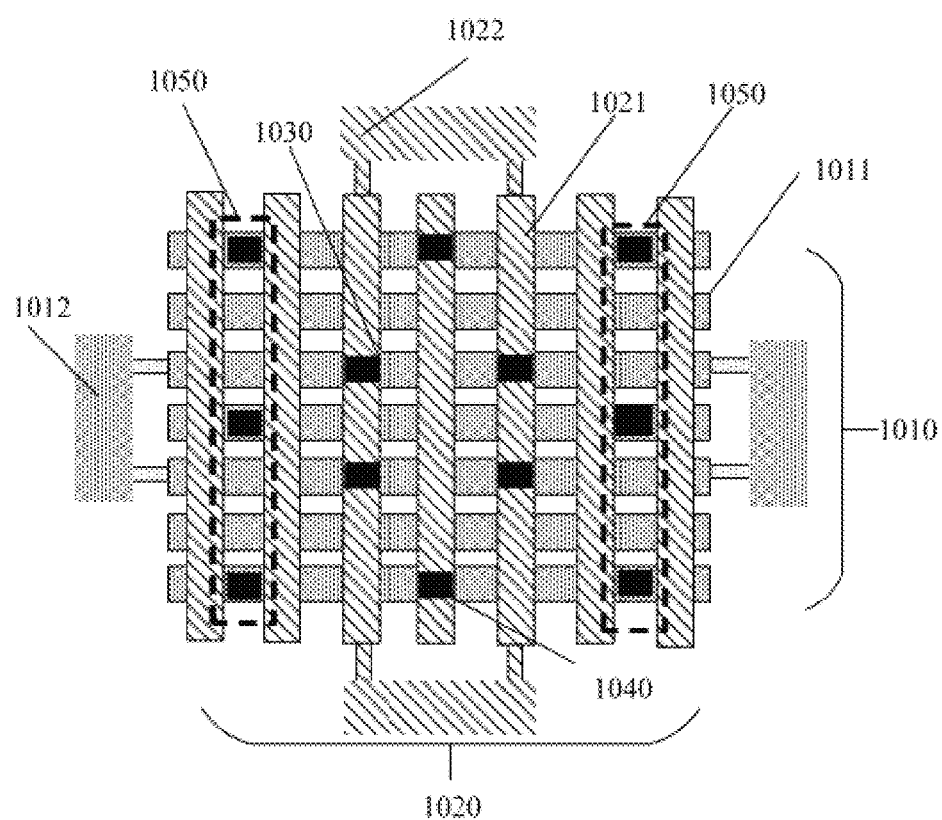
FIG. 10 is a sixth schematic diagram of a semiconductor structure provided in an embodiment of the disclosure.

In the embodiment of the disclosure, a structure of the vias with a shape of "3×3 and 2×2" is adopted. As illustrated in FIG. 10, the first metal layer 1010 includes a plurality of bottom metal wires 1011, and the second metal layer 1020 includes a plurality of top metal wires 1021. At the four overlapping positions where two of the bottom metal wires intersect with two of the top metal wires respectively, four test vias 1030 are disposed, and the four test vias are communicated to the bottom metal wires and the top metal wires. Moreover, an insulating layer (not illustrated in the figure) is provided between the first metal layer 1010 and the second metal layer 1020.

The two bottom metal wires 1011 connected with the four test vias 1030 are connected through the test pads 1012, and the two top metal wires 1021 connected with the four test vias 1030 are connected through the test pads 1022, so that the four test vias 1030 are synchronously tested by utilizing the test pads 1012 and 1022.

The outside of the four test vias 1030 is also provided with auxiliary vias 1040 and dummy vias 1050, the auxiliary vias 1040 may be communicated with two metal wires of the first metal layer 1010 and two metal wires of the second metal layer 1020. The auxiliary vias 1040 may be configured to perform auxiliary test or to support the whole semiconductor structure. Moreover, in order to stabilize the whole semiconductor structure, dummy vias 1050 may also be disposed. The dummy vias 1050 are connected with the bottom metal layer 1020, penetrate through the insulating layer between the first metal layer 1010 and the second metal layer 1020, but are not connected with the top metal layer.

Figure 11:
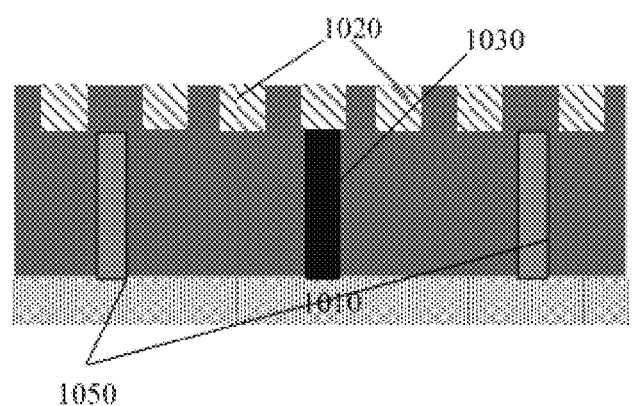
FIG. 11 is a sectional diagram of positions of dummy vias in a semiconductor structure provided in an embodiment of the disclosure.

The dummy vias 1050 and other vias may be configured to form a stable and symmetrical structure and reduce the possibility of deformation of the test vias. Therefore, the dummy vias 1050 do not need to have conductivity, and the dummy vias 1050 may be filled with an insulating material, as illustrated in FIG. 11.

It should be understood that "one embodiment" or "an embodiment" mentioned throughout the description means that specified features, structures, or characteristics related to the embodiment are included in at least one embodiment of the disclosure. Therefore, "in one embodiment" or "in an embodiment" appeared throughout the description does not necessarily refer to a same embodiment. In addition, these specified features, structures, or characteristics may be combined in one or more embodiments in any appropriate manner. It should be understood that, in the various embodiments of this disclosure, sequence numbers of each of the foregoing processes do not mean execution sequences. The execution sequences of the processes shall be determined according to functions and intrinsic logic of the processes, and shall not be construed as any limitation on the implementation processes of the embodiments of the disclosure. The above-mentioned sequence numbers of the embodiments of the disclosure are merely for the description, and do not represent the merits of the embodiments.

It is to be noted that, in this context, terms "include" and "contain" or any other variants thereof are intended to cover non-exclusive inclusions, so that, a process, a method, an item or an apparatus including a series of elements not only includes those elements but also includes other elements which are not clearly listed or further includes intrinsic elements of the process, the method, the item or the apparatus. Without further limitations, an element defined by a statement "including a/an . . . " does not exclude existence of additional identical elements in the process, the method, the item or the apparatus.

In several embodiments provided by the disclosure, it should be understood that the disclosed device and method may be implemented in other manners. The embodiments of the device described above are only schematic, for example, division of the units is only a logic function division, and other division manners may be adopted during practical implementation. For example, a plurality of units or components may be combined or integrated into another system, or some characteristics may be neglected or not performed. In addition, coupling or direct coupling or communication connection between each component shown or discussed may be indirect coupling or communication connection, implemented through some interface, of the device or the units, and may be electrical and mechanical or adopt other forms.

The above-mentioned units described as separate parts may be or may not be physically separate, and the parts shown as units may be or may not be physical elements, which may be located in one place or distributed to a plurality of network elements. Part or all of the units may be selected to achieve the objectives of the solutions of the embodiments according to practical requirements.

In addition, each function unit in each embodiment of the disclosure may be integrated into a processing unit, each unit may also serve as an independent unit and two or more than two units may also be integrated into a unit. The integrated unit may be implemented in a hardware form and may also be implemented in form of hardware and software function unit.

The foregoing descriptions are merely implementation manners of the disclosure, but are not intended to limit the scope of protection of the disclosure. Any variation or replacement readily conceivable by a person skilled in the art within the technical scope disclosed in the disclosure shall fall within the scope of protection of the disclosure. Therefore, the scope of protection of the disclosure shall be subject to the scope of protection of the claims.

INDUSTRIAL APPLICABILITY

The embodiment of the disclosure provides a semiconductor structure and a method for manufacturing a semiconductor structure. According to the technical solution provided in the embodiment of the disclosure, at least four vias are adopted to connect a first metal layer and a second metal layer. On the one hand, each via is supported by the other vias and other structures around, which may reduce the inaccurate test caused by the deformation of the vias; on the other hand, the plurality of vias also facilitate a flexible testing, making the test results closer to the actual resistance value of the vias in a device.

The invention claimed is:

1. A semiconductor structure, comprising:
   a semiconductor substrate;
   a first metal layer located on a surface of the semiconductor substrate, wherein the first metal layer comprises a plurality of bottom metal wires distributed in parallel along a first direction;
   a second metal layer located above a surface of the first metal layer, wherein the second metal layer comprises a plurality of top metal wires distributed in parallel along a second direction, and the second direction is perpendicular to the first direction;
   an insulating layer located between the first metal layer and the second metal layer, and configured to isolate the first metal layer from the second metal layer; and
   at least four vias located in the insulating layer and filled with a conductive material, wherein the conductive material is connected between the first metal layer and the second metal layer.

2. The semiconductor structure of claim 1, wherein the at least four vias are respectively located at overlapping positions of at least two of the bottom metal wires in the first metal layer and at least two of the top metal wires in the second metal layer.

3. The semiconductor structure of claim 2, wherein the at least four vias comprises four test vias; and the four test vias are respectively located at four overlapping positions of two of the top metal wires and two of the bottom metal wires.

4. The semiconductor structure of claim 3, wherein a top metal wire is located between and configured to space apart the two top metal wires connected with the test vias, and a bottom metal wire is located between and configured to space apart the two bottom metal wires connected with the test vias.

5. The semiconductor structure of claim 4, wherein the at least four vias further comprise at least one pair of auxiliary vias, the at least one pair of auxiliary vias is connected to the top metal wires configured to space apart the two top metal wires connected with the test vias or the bottom metal wires configured to space apart the two bottom metal wires connected with the test vias, and a spacing between the pair of auxiliary vias is greater than a spacing between any two of the test vias.

6. The semiconductor structure of claim 3, wherein the two top metal wires connected to the test vias are connected through test pads, and the two bottom metal wires connected to the test via are connected through test pads.

7. The semiconductor structure of claim 1, further comprising:
   at least two dummy vias, wherein the dummy vias penetrate through the insulating layer and are connected to any one of the first metal layer or the second metal layer; and a pattern formed by distribution positions of the at least two dummy vias and distribution positions of the at least four vias is centrosymmetric or axisymmetric.

8. The semiconductor structure of claim 7, wherein each of the dummy vias is filled with an insulating material.

9. The semiconductor structure of claim 1, wherein the at least four vias are configured for resistance testing by Kelvin Four-terminal sensing.

10. A method for manufacturing a semiconductor structure, comprising:
    forming a first metal layer on a surface of a semiconductor substrate, wherein the first metal layer comprises a plurality of bottom metal wires distributed in parallel along a first direction;
    covering the first metal layer with an insulating layer;
    forming at least four vias penetrating through the insulating layer and connected to the first metal layer;
    filling the at least four vias with a conductive material; and
    forming a second metal layer on the insulating layer and the at least four vias, wherein the second metal layer comprises a plurality of top metal wires distributed in parallel along a second direction, and the second direction is perpendicular to the first direction;
    wherein the conductive material in the at least four vias is connected between the first metal layer and the second metal layer.

11. The method of claim 10, wherein forming at least four vias penetrating through the insulating layer and connected to the first metal layer comprises:
    forming four test vias penetrating through the insulating layer and connected to two of the bottom metal wires at four target positions of the bottom metal wires, wherein each bottom metal wire comprises two target positions distributed along the second direction, and two adjacent target positions located on the two bottom metal wires are distributed along the first direction; and wherein forming a plurality of top metal wires distributed in parallel along a second direction on the insulating layer and the at least four vias comprises:

forming a top metal wire above two target positions distributed along the first direction, wherein the target positions are the positions where the two top metal wires and the two bottom metal wires overlap.

12. The method of claim 11, wherein forming at least four vias penetrating through the insulating layer and connected to the first metal layer further comprises:

forming at least one pair of auxiliary vias penetrating through the insulating layer and connected to different bottom metal wires respectively on a top metal wire located between the two top metal wires, wherein a spacing between the pair of auxiliary vias is greater than a spacing between any two of the test vias.

13. The method of claim 10, further comprising:

forming at least two dummy vias, wherein the dummy vias penetrate through the insulating layer and are connected to any one of the first metal layer or the second metal layer, and a pattern formed by distribution positions of the at least two dummy vias and distribution positions of the at least four vias is centrosymmetric or axisymmetric.

14. The method of claim 13, further comprising:

filling the at least two dummy vias with an insulating material.

15. The method of claim 14, wherein the dummy vias are connected to the first metal layer, and the method further comprises:

forming a covering layer, wherein the covering layer is filled between the top metal wires and covers the dummy vias.

* * * * *